(12) United States Patent
Jessup et al.

(10) Patent No.: US 7,766,665 B2
(45) Date of Patent: Aug. 3, 2010

(54) PRINTED CIRCUIT BOARD DIRECT CONNECTION AND METHOD OF FORMING THE SAME

(75) Inventors: Fred Jessup, Moscow, ID (US); Erik Cegnar, Moscow, ID (US); Mike Maughan, Moscow, ID (US); David G. Alexander, Moscow, ID (US)

(73) Assignee: IVUS Industries, Inc., Moscow, ID (US)

( * ) Notice: Subject to any disclaimer, the term of this patent is extended or adjusted under 35 U.S.C. 154(b) by 0 days.

(21) Appl. No.: 12/364,445

(22) Filed: Feb. 2, 2009

(65) Prior Publication Data

US 2009/0197435 A1 Aug. 6, 2009

Related U.S. Application Data

(60) Provisional application No. 61/025,225, filed on Jan. 31, 2008.

(51) Int. Cl.
H01R 12/00 (2006.01)
H05K 1/00 (2006.01)
(52) U.S. Cl. ..................................... 439/65
(58) Field of Classification Search ................. 439/65, 439/74, 79, 83
See application file for complete search history.

(56) References Cited

U.S. PATENT DOCUMENTS

| | | |
|---|---|---|
| 2,844,807 A | 7/1958 | McMulkin |
| 3,173,732 A | 3/1965 | James |
| 3,973,817 A | 8/1976 | Stalley et al. |
| 4,037,898 A | 7/1977 | Guyette |
| 4,054,345 A | 10/1977 | Sherwood |
| 4,331,370 A | 5/1982 | Andrews et al. |
| 4,482,937 A | 11/1984 | Berg |
| 4,513,064 A | 4/1985 | Marcus |
| 4,600,256 A | 7/1986 | Anttila |
| 4,681,549 A | 7/1987 | Peterson |
| 4,836,792 A | 6/1989 | Glover |
| 5,110,298 A | 5/1992 | Dorinski et al. |
| 5,244,395 A | 9/1993 | DeSantis et al. |
| 5,321,585 A | 6/1994 | Trittschuh, III et al. |
| 5,479,320 A | 12/1995 | Estes et al. |
| 5,938,455 A * | 8/1999 | Glovatsky et al. ............. 439/74 |
| 6,062,916 A | 5/2000 | Gladd et al. |
| 6,183,301 B1 | 2/2001 | Paagman |
| 6,223,973 B1 | 5/2001 | Wong et al. |
| 6,544,045 B1 | 4/2003 | Paagman |
| 6,794,580 B2 | 9/2004 | Joshi et al. |
| 7,019,984 B2 | 3/2006 | Driscoll et al. |
| 7,128,623 B2 | 10/2006 | Kitajima |

* cited by examiner

Primary Examiner—Javaid Nasri
(74) Attorney, Agent, or Firm—Stephen M. Nipper; Dykas, Shaver & Nipper, LLP

(57) ABSTRACT

A system for directly connecting multiple printed circuit boards (PCB) circuits without the need for peripheral connectors. Multiple PCBs are electrically and mechanically interfaced with one or more plated holes or tabs on at least one first PCB and one or more plated tabs or holes on at least one second PCB. The plated tab(s)/hole(s) from said second PCB mate with the corresponding plated tab(s)/hole(s) from said first PCB to form a mechanical and electrical interconnect.

24 Claims, 4 Drawing Sheets

PRINTED CIRCUIT BOARD DIRECT CONNECTION AND METHOD OF FORMING THE SAME

CROSS-REFERENCE TO RELATED APPLICATIONS

This application claims the priority date of the provisional application entitled PIN-HOLE PRINTED CIRCUIT BOARD DIRECT CONNECTION AND METHOD OF FORMING THE SAME, filed by Jessup, et. al on Jan. 31, 2008, with application Ser. No. 61/025,225, the disclosure of which is incorporated herein by reference.

FIELD OF THE INVENTION

The invention relates generally to printed circuit boards (PCBs), and more particularly to electrically and mechanically interfacing multiple PCBs.

DESCRIPTION OF THE PREFERRED EMBODIMENTS

Figure 1:
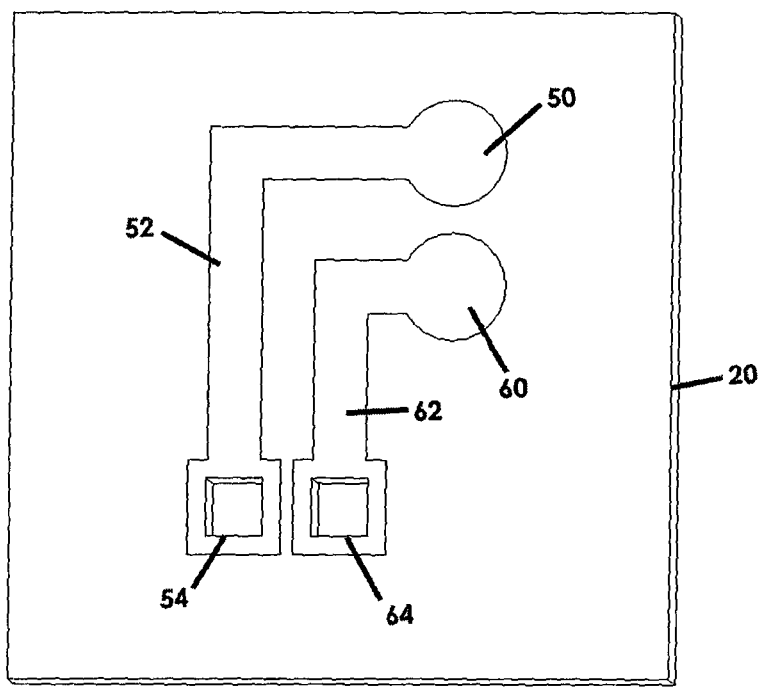
FIG. 1 is a perspective view of a first printed circuit board having plated holes.

While the invention is susceptible of various modifications and alternative constructions, certain illustrated embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims.

In the following description and in the figures, like elements are identified with like reference numerals. The use of "e.g.," "etc," and "or" indicates non-exclusive alternatives without limitation unless otherwise noted. The use of "including" means "including, but not limited to," unless otherwise noted. A "tab" is a protrusion of the PCB material. A "hole" is defined by an amount of PCB material that has been removed from the PCB by means of drilling, cutting, routering, or by other PCB material removal methods or is otherwise formed through the PCB material. "Plating" refers to the deposition and/or attachment of a metallic conductor (electrically conductive material), such as copper, to circuit board base material. A "plated tab" or "plated hole" is respectively a tab or hole that has undergone a plating process where electrically conductive material (metallic conductor) has been deposited on or attached to the PCB material at or around at least a portion of said tab or hole.

Holes are preferably defined in and extending through the printed circuit board, having a first end opening and a second end opening. A hole can be formed various ways, including but not limited to the removal of an amount of PCB material by means of drilling, cutting, and/or routering. Tabs are preferably defined as extensions from a portion of the printed circuit board. A tab can be formed various ways, including but not limited to the removal of an amount of PCB material by means of drilling, cutting, and/or routering.

The present invention is a system for connecting printed circuit boards (PCBs) together and the method for manufacturing the same.

Referring initially to FIG. 1, shown is a first printed circuit board 20 having a first conductive pathway (trace) 52 and a second conductive pathway (trace) 62. The first conductive pathway 52 electrically connecting a first electrical node 50 of an electrical component (e.g., integrated circuit, capacitor, resistor, switch) to a first hole 54 defined within the first printed circuit board 20. Shown is also a second conductive pathway 62 electrically connecting a second node 60 of an electrical component to a second hole 64 defined within the first printed circuit board 20.

Optionally, one or more orifices (76, 86, 116, 126) may be provided through a tab, such an orifice could be filled with solder during the soldering process, providing additional strength to the connection.

While FIG. 1 shows two traces, nodes and holes, it is envisioned that the number of such structures may be one or more.

Figure 2:
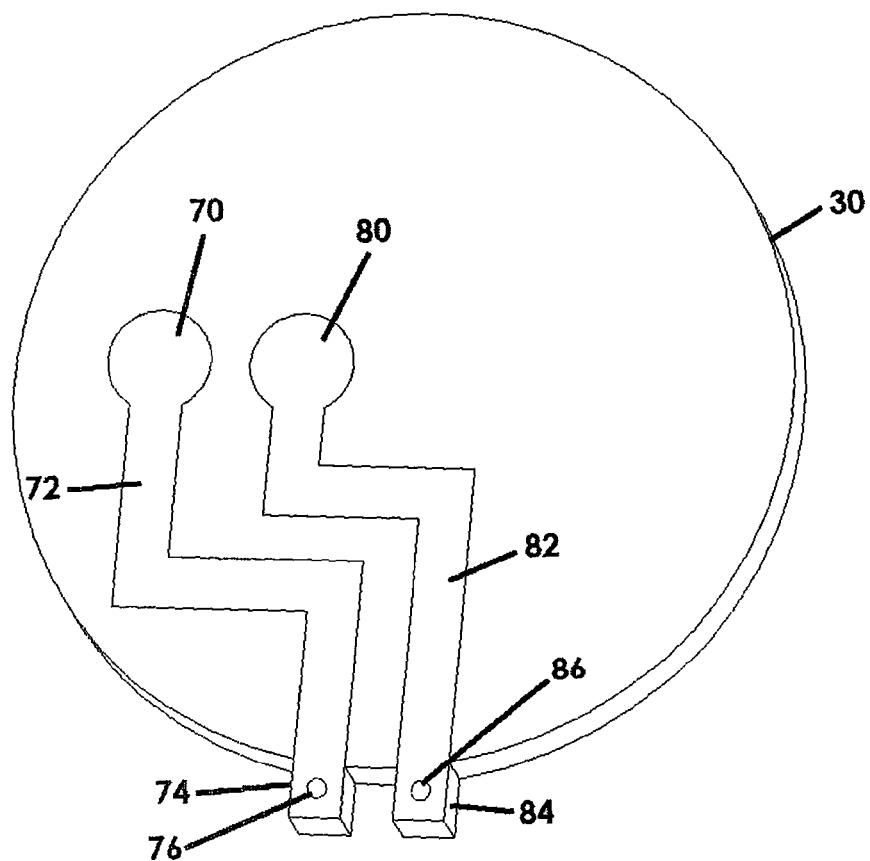
FIG. 2 is a perspective view of a second printed circuit board having plated tabs.

Referring now to FIG. 2, shown is a second printed circuit board 30 having a third conductive pathway (trace) 72 and a fourth conductive pathway (trace) 82. The first conductive pathway 72 electrically connecting a third node 70 of an electrical component (e.g., integrated circuit) to a first tab (pin) 74 extending from the second printed circuit board 30. Shown is also a fourth conductive pathway 82 electrically connecting a fourth node 80 of an electrical component (e.g., integrated circuit) to a second tab (pin) 84 extending from the second printed circuit board 30.

Figure 3:
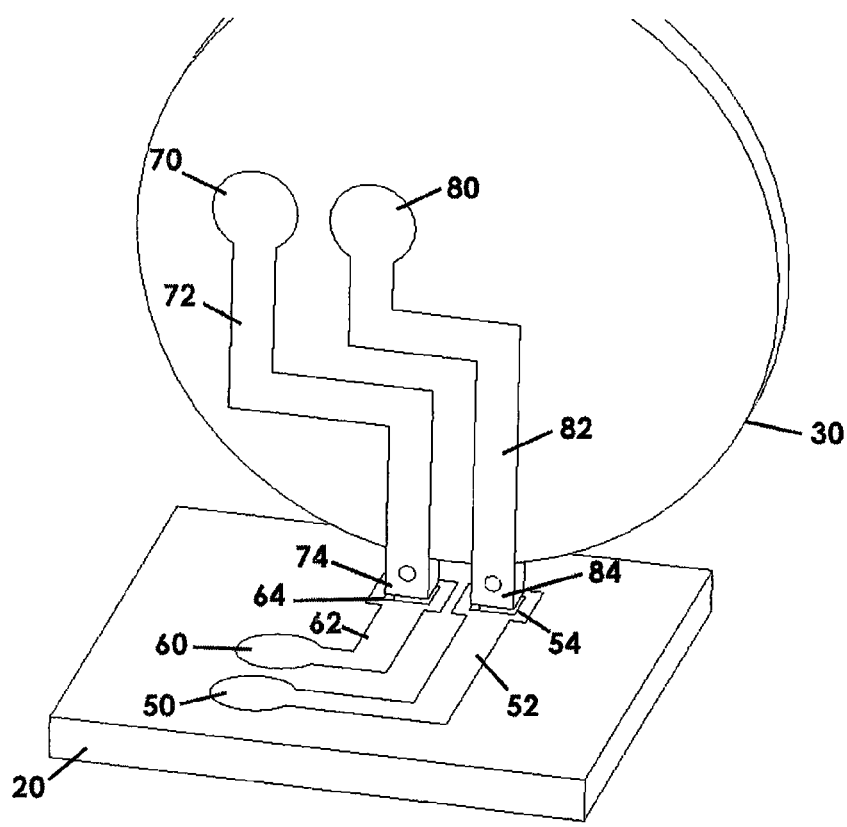
FIG. 3 is an upper perspective view of the printed circuit board of FIG. 1 mating with the printed circuit board of FIG. 2.
Figure 4:
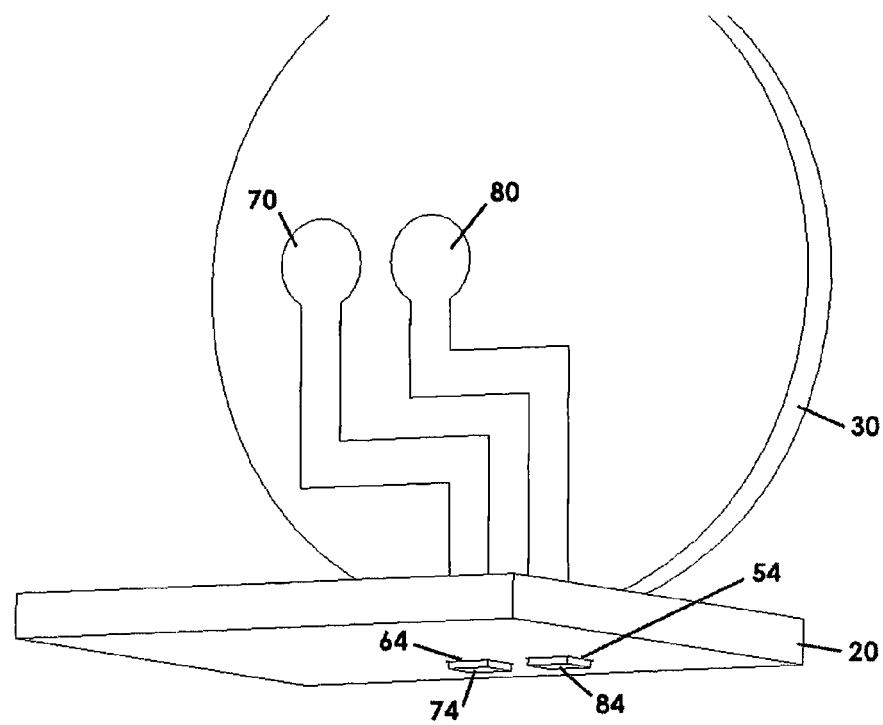
FIG. 4 is a lower perspective view of the printed circuit board of FIG. 1 mating with the printed circuit board of FIG. 2.

Referring now to FIG. 3, the two circuit boards (20, 30) are shown electrically connected together, by the first tab 74 of the second printed circuit board 30 being inserted into the first hole 54 of the first printed circuit board 20, and the second tab 84 of the second printed circuit board 30 being inserted into the second hole 64 of the first printed circuit board 20. Either the first or second printed circuit board contains a feature to maintain spacing between the two boards. FIG. 4 shows a lower perspective view whereby the distal ends of the tabs 74, 84 can be seen extending out of the holes 54, 64, as is preferred.

While this embodiment shows a first printed circuit board with pair of holes and a second printed circuit board with a pair of tabs, other configurations are possible, including but not limited to one or more tabs and/or holes on each printed circuit board.

This connection (shown in FIGS. 3 and 4) between the first printed circuit board 20 and the second printed circuit board 30 serves as an electrical path between the first and second printed circuit boards, electrically connecting the first node 50 to the fourth node 80 and the second node 60 to the third node 70.

As shown in FIG. 4, once mated, electrical signals are routed through the connection between a plated hole and a plated tab. The mated tabs and hole can then be soldered to improve the electrical conductivity of the interconnection of said first printed circuit board and said second printed circuit board. Said soldered interconnection also improves structural rigidity of the mated first printed circuit board and second printed circuit board.

Figure 7:
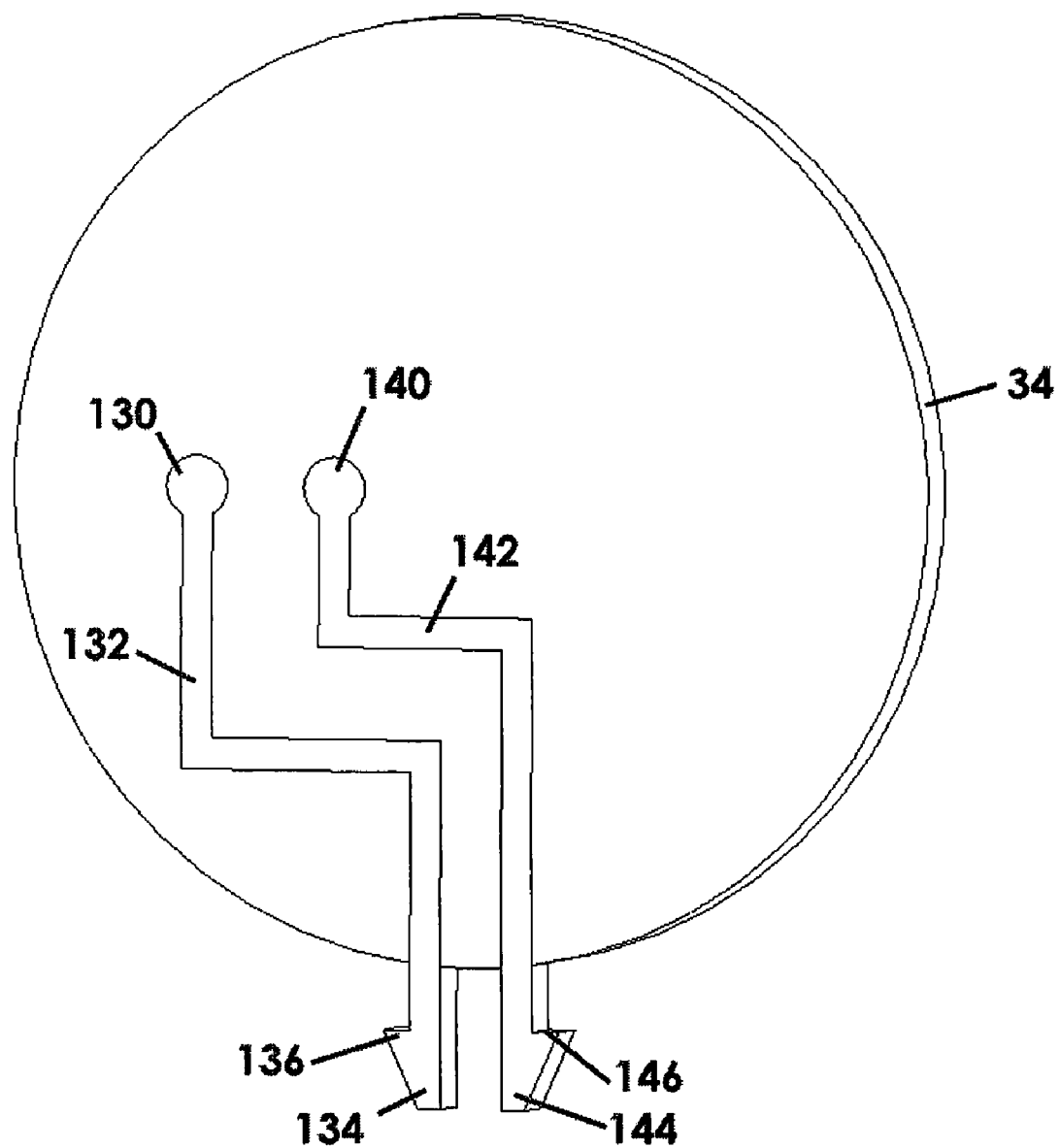
FIG. 7 is a perspective view of a fourth printed circuit board having snap action plated tabs.

While a soldered connection is preferred, in other embodiments, the tab may be shaped in such a way that mechanical coupling or snap action occurs. For instance, the embodiment of FIG. 7 showing a first node 130, a second node 140, a first trace 132, a second trace 142, a first tab 134, a second tab 144, a first locking means (mechanical coupler) 136 and a second locking means (mechanical coupler) 146. These tabs configured for snapping into mating holes, such as those shown in the printed circuit board 20 of FIG. 1.

In the embodiment shown in FIG. 4, the first and second printed circuit boards are orthogonally oriented relative to one another, however non-orthogonal orientations are also possible.

A "tab" is a protrusion of the PCB material. A tab can be formed in the PCB material by drilling, cutting, routering, or other forms of fabrication such that surrounding PCB material is removed leaving an exposed region.

A "hole" is an amount of PCB material that has been removed from the PCB by means of drilling, cutting, routering, or by other PCB material removal methods. It is preferred that the hole extend through the PCB.

The term "plating" referring to the deposition and/or attachment of a metallic conductor (electrically conductive material), such as copper, to circuit board base material. A "plated tab" or "plated hole" is respectively a tab or hole that has undergone a plating process where electrically conductive material (metallic conductor, such as copper) has been deposited on or attached to the PCB material at or around at least a portion of said tab or hole. Preferably, a plated tab is composed of electrically conductive material on the bottom, top, and end. Preferably, a plated hole is entirely plated on all sides. It is further preferred that a mated plated tab and plated hole be configured for frictionally fitting together so that the tab releasably connects with said hole.

Figure 5:
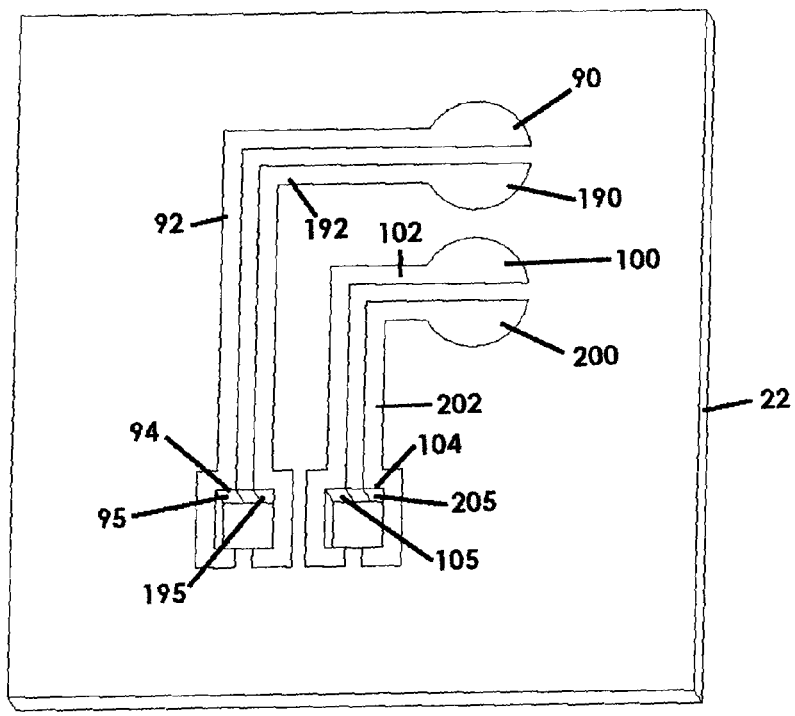
FIG. 5 is a perspective view of a third printed circuit board having plated holes with multiple electrical traces.
Figure 6:
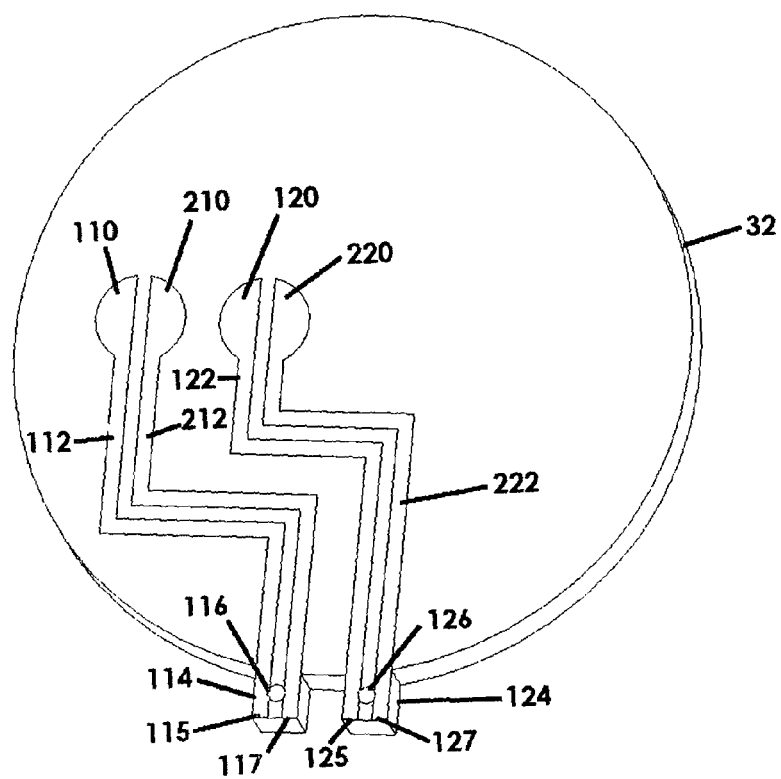
FIG. 6 is a perspective view of a fourth printed circuit board having plated tabs with multiple electrical traces.

Referring now to FIGS. 5 and 6, it is also possible for a tab or hole to contain multiple (two or more) electrical traces. For instance, FIG. 5 shows a printed circuit board 22 having a first node 90, a second node 190, a third node 100, and a fourth node 200. The first node 90 having a conductive pathway (trace) 92, the second node 190 having a conductive pathway (trace) 192, the third node 100 having a conductive pathway (trace) 102, and the fourth node 200 having a conductive pathway (trace) 202. The first and second nodes connected to a shared (but not electrically connected) first hole 94, whereas the third and fourth nodes are connected to a shared (but not electrically connected) second hole 104. The first hole 94 defining a first plated portion 95 connecting with the conductive pathway 92 and a second plated portion 195 connecting with the conductive pathway 192. The second hole 104 defining a first plated portion 105 connecting with the conductive pathway 192 and a second plated portion 205 connecting with the conductive pathway 202.

FIG. 6 shows a printed circuit board 32 having a fifth node 110, a sixth node 210, a seventh node 120, and an eighth node 220. The fifth node 110 having a conductive pathway (trace) 112, the sixth node 210 having a conductive pathway (trace) 212, the seventh node 120 having a conductive pathway (trace) 122, and the eighth node 220 having a conductive pathway (trace) 222. The fifth and sixth nodes connected to a shared (but not electrically connected) first tab 114, whereas the seventh and eighth nodes are connected to a shared (but not electrically connected) second tab 124. The first tab 114 defining a first plated portion 115 connecting with the conductive pathway 112 and a second plated portion 117 connecting with the conductive pathway 212. The second tab 124 defining a first plated portion 125 connecting with the conductive pathway 122 and a second plated portion 127 connecting with the conductive pathway 222.

When the embodiment of FIG. 5 and FIG. 6 are connected together (not shown in the drawings), the first node 90 would be electrically connected to the fifth node 110, the second node 190 would be electrically connected with the sixth node 210, the third node 100 would be electrically connected with the seventh node 120, and the fourth node 200 would be electrically connected with the eighth node 220.

While the invention is susceptible to various modifications and alternative constructions, certain illustrated embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined herein.

Use of the invented method has a number of potential manufacturing benefits, including but not limited to reducing cost by eliminating standard pin or header connectors, providing structural rigidity for the assembly, and providing an electrical connection suitable for signals of high and low speed, high and low current, and high and low voltage.

The purpose of the Abstract of the Disclosure is to enable the public, and especially the scientists, engineers, and practitioners in the art who are not familiar with patent or legal terms or phraseology, to determine quickly from a cursory inspection, the nature and essence of the technical disclosure of the application. The Abstract of the Disclosure is neither intended to define the invention of the application, nor is it intended to be limiting as to the scope of the invention in any way.

Still other features and advantages of the present invention will become readily apparent to those skilled in this art from this disclosure's detailed description describing preferred embodiments of the invention, simply by way of illustration of the best mode contemplated by carrying out our invention. As will be realized, the invention is capable of modification in various obvious respects all without departing from the invention. Accordingly, the drawings and description of the preferred embodiments are to be regarded as illustrative in nature, and not as restrictive in nature.

What is claimed is:

1. A system for interconnecting printed circuit boards, said system comprising:
    a first printed circuit board comprised of printed circuit board material, said first printed circuit board having at least one first conductive pathway, said first printed circuit board having a top surface parallel to a bottom surface, said first printed circuit board having a hole defined therein, extending from said top surface to said bottom surface perpendicular to said top and bottom surfaces, said first conductive pathway electrically connecting an electrical node of a first electrical component to said hole, and
    a second printed circuit board comprised of printed circuit board material, said second printed circuit board having a top surface parallel to a bottom surface and an edge extending between said top surface and said bottom surface, said edge generally perpendicular to said top and bottom surfaces, said second printed circuit board comprising a tab of printed circuit board material extending from said edge, said tab sized to frictionally interfit into said hole, said second printed circuit board having at least one second conductive pathway, said second conductive pathway electrically connecting an electrical node of a second electrical component to said tab;

wherein the second printed circuit board tab is inserted into said first printed circuit board hole, being frictionally held therein, thereby electrically connecting the node of said first electrical component to said node of said second electrical component.

2. The system of claim 1, wherein said tab is fixed within said hole via soldering.

3. The system of claim 2, wherein said tab comprises an orifice defined there-through, said orifice configured for receiving solder there-through.

4. The system of claim 1, wherein said tab is longer than said hole, said tab terminating in a tip, wherein said tip extends out of said hole when said tab is inserted into said hole.

5. The system of claim 1, wherein said first printed circuit board comprises a plurality of holes and said second printed circuit board comprises an equivalent number of tabs, wherein said tabs and holes are spaced and oriented for interconnection.

6. The system of claim 1, wherein said first printed circuit board further comprises a second hole configured for connection to a second tab provided through said second printed circuit board.

7. The system of claim 1, wherein said tab further comprises a mechanical coupler for locking said tab in said hole.

8. The system of claim 1, wherein said first printed circuit board is connected to said second printed circuit board, said boards are orthogonally oriented to one another.

9. The system of claim 1, wherein at least a portion of said tab is plated with an electrically conductive material.

10. The system of claim 1, wherein at least a portion of said hole is plated with an electrically conductive material.

11. The system of claim 1, wherein said at least one first conductive pathway comprises:
a primary first conductive pathway electrically connecting said electrical node of said first electrical component to a first portion of said hole, and
a secondary first conductive pathway electrically connecting an electrical node of a third electrical component to a second portion of said hole, said first and second portions of said hole electrically isolated.

12. The system of claim 11, wherein said at least one second conductive pathway comprises:
a primary second conductive pathway electrically connecting said electrical node of said second electrical component to a first portion of said tab, and
a secondary second conductive pathway electrically connecting an electrical node of a fourth electrical component to a second portion of said tab, said first and second portions of said tab electrically isolated.

13. The system of claim 12, wherein insertion of the second printed circuit board tab into said first printed circuit board hole electrically connects the node of said first electrical component to said node of said second electrical component, and the node of said third electrical component to said node of said fourth electrical component.

14. A system for interconnecting printed circuit boards, said system comprising:
a first printed circuit board comprised of printed circuit board material, said first printed circuit board having at least one first conductive pathway, said first printed circuit board having a top surface parallel to a bottom surface, said first printed circuit board having a hole defined therein, extending from said top surface to said bottom surface perpendicular to said top and bottom surfaces, said first conductive pathway electrically connecting an electrical node of a first electrical component to said hole, and a second printed circuit board comprised of printed circuit board material, said second printed circuit board having a top surface parallel to a bottom surface and an edge extending between said top surface and said bottom surface, said edge generally perpendicular to said top and bottom surfaces, said second printed circuit board comprising a tab of printed circuit board material extending from said edge, said second printed circuit board having at least one second conductive pathway, said second conductive pathway electrically connecting an electrical node of a second electrical component to said tab;

wherein the second printed circuit board tab is inserted into said first printed circuit board hole, thereby electrically connecting the node of said first electrical component to said node of said second electrical component, wherein said tab is fixed within said hole via soldering.

15. The system of claim 14, wherein said tab is sized to frictionally interfit into said hole, and wherein when said tab is inserted into said hole it is frictionally held therein.

16. The system of claim 14, wherein said tab is longer than said hole, said tab terminating in a tip, wherein said tip extends out of said hole when said tab is inserted into said hole.

17. The system of claim 14, wherein said first printed circuit board comprises a plurality of holes and said second printed circuit board comprises an equivalent number of tabs, wherein said tabs and holes are spaced and oriented for interconnection.

18. The system of claim 14, wherein said first second printed circuit board further comprises a second tab configured for connection to a second hole provided through said first printed circuit board.

19. The system of claim 14, wherein said tab comprises an orifice defined there-through, said orifice configured for receiving solder there-through.

20. The system of claim 14, wherein said at least one first conductive pathway comprises:
a primary first conductive pathway electrically connecting said electrical node of said first electrical component to a first portion of said hole, and
a secondary first conductive pathway electrically connecting an electrical node of a third electrical component to a second portion of said hole, said first and second portions of said hole electrically isolated.

21. The system of claim 20, wherein said at least one second conductive pathway comprises:
a primary second conductive pathway electrically connecting said electrical node of said second electrical component to a first portion of said tab, and
a secondary second conductive pathway electrically connecting an electrical node of a fourth electrical component to a second portion of said tab, said first and second portions of said tab electrically isolated.

22. The system of claim 21, wherein insertion of the second printed circuit board tab into said first printed circuit board hole electrically connects the node of said first electrical component to said node of said second electrical component, and the node of said third electrical component to said node of said fourth electrical component.

23. A system for interconnecting printed circuit boards, said system comprising:
- a first printed circuit board comprised of printed circuit board material, said first printed circuit board having at least one first conductive pathway, said first printed circuit board having a top surface parallel to a bottom surface, said first printed circuit board having a hole defined therein, extending from said top surface to said bottom surface perpendicular to said top and bottom surfaces, said first conductive pathway electrically connecting an electrical node of a first electrical component to said hole, and
- a second printed circuit board comprised of printed circuit board material, said second printed circuit board having a top surface parallel to a bottom surface and an edge extending between said top surface and said bottom surface, said edge generally perpendicular to said top and bottom surfaces, said second printed circuit board comprising a tab of printed circuit board material extending from said edge, said tab sized to frictionally interfit into said hole, said second printed circuit board having at least one second conductive pathway, said second conductive pathway electrically connecting an electrical node of a second electrical component to said tab;
- wherein the second printed circuit board tab is inserted into said first printed circuit board hole, being frictionally held therein, thereby electrically connecting the node of said first electrical component to said node of said second electrical component;
- wherein said at least one first conductive pathway comprises at a primary first conductive pathway electrically connecting an electrical node of a first electrical component to a first portion of said hole and a secondary first conductive pathway electrically connecting an electrical node of a third electrical component to a second portion of said hole, said first and second portions of said hole electrically isolated;
- wherein said at least one second conductive pathway comprises at a primary second conductive pathway electrically connecting an electrical node of a second electrical component to a first portion of said tab and a secondary second conductive pathway electrically connecting an electrical node of a fourth electrical component to a second portion of said tab, said first and second portions of said tab electrically isolated;
- wherein insertion of the second printed circuit board tab into said first printed circuit board hole electrically connecting the node of said first electrical component to said node of said second electrical component, and the node of said third electrical component to said node of said fourth electrical component.

24. The system of claim 23, wherein said tab is fixed within said hole via soldering, and wherein said tab comprises an orifice defined there-through, said orifice configured for receiving solder there-through.

* * * * *